(12) United States Patent
White (10) Patent No.: US 7,671,283 B2
(45) Date of Patent: Mar. 2, 2010

(54) APPARATUS FOR SHIELDING ELECTROMAGNETIC RADIATION

(75) Inventor: Joseph White, Windsor, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 738 days.

(21) Appl. No.: 11/038,964

(22) Filed: Jan. 20, 2005

(65) Prior Publication Data
US 2006/0157273 A1    Jul. 20, 2006

(51) Int. Cl.
H05K 9/00 (2006.01)
(52) U.S. Cl. .................. 174/354; 174/355; 174/369; 174/373
(58) Field of Classification Search ............... 174/354, 174/355, 369, 373; 277/920; 361/816, 818
See application file for complete search history.

(56) References Cited

U.S. PATENT DOCUMENTS

| 3,904,810 | A | 9/1975 | Kraus |
| 5,083,239 | A | 1/1992 | Sedlemeier et al. |
| 6,201,182 | B1 * | 3/2001 | Sosnowski .................. 174/369 |
| 6,320,120 | B1 * | 11/2001 | Van Haaster ................ 174/369 |
| 2005/0086786 | A1 * | 4/2005 | Sosnowski .................... 29/428 |

FOREIGN PATENT DOCUMENTS

| GB | 2162695 A | 2/1986 |
| GB | 2184294 A | 6/1987 |
| GB | 2257839 A | 1/1993 |
| GB | 2372152 A | 8/2002 |
| JP | 02246199 A | 10/1990 |
| JP | 2003-31984 | * 1/2003 |

* cited by examiner

Primary Examiner—Hung V Ngo (57) ABSTRACT

A gasket and gasket system for diminishing electromagnetic radiation from an enclosure having two edges remote from one another. The gasket has tangs on one edge for gripping one enclosure edge, and tangs on the other edge for gripping the other enclosure edge. The gasket system includes the combination of an enclosure member having two edges remote from one another with a two-sided gasket having tangs on one side engaged in gripping one enclosure edge, and tangs on the other edge engaged in gripping the other enclosure edge.

16 Claims, 8 Drawing Sheets

APPARATUS FOR SHIELDING ELECTROMAGNETIC RADIATION

BACKGROUND OF THE INVENTION

1. Field of the Invention

The invention pertains generally to the field of mitigating electromagnetic radiation generated by electronic devices, particularly devices that generate high-frequency signals. More particularly, this invention pertains to apparatus for reducing emission of electromagnetic radiation through gaps in enclosures of electronic equipment.

2. Discussion of the Related Art

In the operation of electronic devices, electromagnetic waves are generated in addition to intended electrical signals. This electromagnetic interference (or EMI) is undesirable and, if strong enough, has the ability to interfere with radio communications or the operation of nearby electronic apparatus. The Federal Communications Commission (FCC) strictly regulates the amount of electromagnetic emissions that may radiate from a product. All computer equipment sold in the United States must demonstrate compliance with FCC-mandated electromagnetic emission levels. To attenuate the amount of electromagnetic waves emitted, devices are equipped with an electromagnetic containment feature, such as a metallic enclosure, to keep the waves from exiting the device. This ensures that the electronic device will have electromagnetic compatibility with any neighboring apparatus.

Electromagnetic containment devices are typically shielded and electrically grounded. Shielding is designed to prevent both ingress and egress of electromagnetic energy. Where the shielding is incomplete due to gaps, EMI is not fully blocked and its effects not fully minimized. In the case of a metal enclosure, these gaps create discontinuities in the conductivity of the enclosure, which in turn compromises the efficiency of the ground conduction path through the enclosure. Moreover, by presenting a conductivity level at the gaps that is significantly different from that of the enclosure as a whole, the gaps can act as slot antennae, and the enclosure itself can become a secondary source of EMI. Finally, to achieve full blockage of EMI radiation over a wide bandwidth, no gaps above a specified size may exist in the shield. The higher the frequency of the EMI, the smaller the gaps must be.

In practice, computer enclosures usually have several gaps, including gaps to accommodate connectors, gaps to admit disks of various kinds, and gaps created by doors, access panels and assembly joints. Despite this, EMI requirements for most computer systems have been easily complied with in the past using relatively simple, low-cost enclosures. However, the advent of modern computer systems with chip speeds exceeding a gigahertz has made compliance with EMI requirements more difficult and rendered unacceptable the computer cabinets of the past.

Specialized EMI gaskets have been developed for use in computer gaps to provide at least a degree of EMI shielding while permitting unfettered operation of the computer enclosure doors and access panels. To shield EMI effectively, a gasket should be capable of absorbing or reflecting EMI as well as establishing a continuous conductive path across the gap in which the gasket is disposed.

Metallic gaskets manufactured from beryllium copper are widely employed for EMI shielding due to their high level of electrical conductivity. These gaskets typically take the form of fingers projecting from a strip. The fingers provide spring and wiping actions when compressed. Other types of EMI gaskets include metalized fabric, closed-cell foam sponges knitted with metallic wire mesh, silicone tubing knitted with metallic wire mesh, and strips of rolled metallic wire mesh, with or without foam or tubing inserts.

Finger-style EMI gaskets can be relatively fragile and can be damaged when not handled properly. Damage can create metal fragments, which can find their way into any of the electronic circuitry in the computer, including not only the computing circuitry, but also the circuitry of the power supply. Mechanical problems also can result, including snags, poor fit and possible injury to handlers.

Efforts to remedy these problems have centered on replacing finger-type gaskets with the soft gaskets described above. This solution has had various problems of its own, including short material life, mounting difficulties, poor EMI shielding relative to metal gaskets, flammability and compression set.

Another effort to remedy the problems with finger-style gaskets has been to use a fingerless gasket in the form of a rectangle with a raised section centered along the longitudinal axis of the rectangle, with the raised section providing the gasketing action. These gaskets have been deployed in pairs on either side of the edge of an enclosure opening and have proven to be effective in stopping leakage of EMI. However, difficulties have been encountered in fastening these gaskets where needed.

Two approaches have been tried. One has been to glue the gaskets to the enclosure with pressure-sensitive adhesive. However, the adhesive will fail if the gasket is snagged, and the adhesive may lose its grip over time. The second approach has been to use snap-on plastic clips on each side of the enclosure wall. However, these clips protrude several millimeters beyond the surface of the wall and may interfere with the gasket on the opposite side of the wall.

SUMMARY

On embodiment of the present invention is directed to a gasket for diminishing electromagnetic radiation from an enclosure having a first enclosure edge and a second enclosure edge remote from the first enclosure edge. The gasket comprises a gasket body having opposed first and second body edges, a plurality of first tangs on the first body edge for gripping the first enclosure edge, and a plurality of second tangs on the second body edge for gripping the second enclosure edge.

In another aspect, a gasket system for diminishing the emission of electromagnetic radiation from an enclosure is disclosed. The system comprises an enclosure member having a first enclosure side, a second enclosure side opposite from the first enclosure side, and first and second enclosure edges that are remote from one another. The system further includes a first gasket member disposed on the first enclosure side, the first gasket member having first and second gasket edges. The first gasket edge comprises a plurality of first tangs gripping the first enclosure edge and the second gasket edge comprising a plurality of second tangs gripping the second enclosure edge. The system further has a second gasket member disposed on the second enclosure side. The second gasket member comprising third and fourth gasket edges, the third gasket edge comprising a plurality of third tangs gripping the first enclosure edge and the fourth gasket edge comprising a plurality of fourth tangs gripping the second enclosure edge.

DETAILED DESCRIPTION OF THE DRAWINGS

Figure 1:
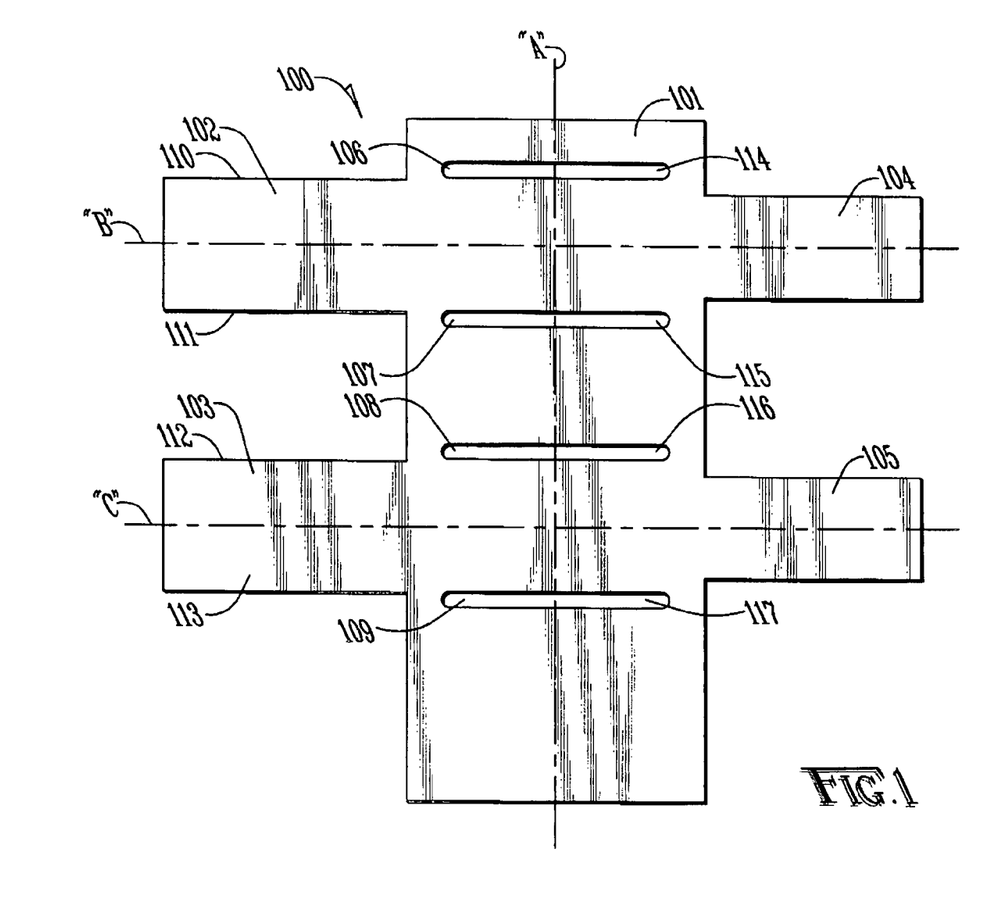
FIG. 1 depicts a gasket blank of an exemplary embodiment of the present invention.

One embodiment of the present invention is directed to a gasket for diminishing electromagnetic radiation from an enclosure by providing a seal on opposing sides of the enclosure. FIG. 1 depicts an exemplary embodiment of a gasket blank 100 of the present invention. Gasket blank 100 is stamped from a thin sheet of beryllium copper having a uniform thickness. Those of skill in the art will appreciate that other materials and other thicknesses may be used. Alternative materials include conductive metalized plastic. Alternative thicknesses may be multiple or non-uniform thicknesses where appropriate to the application.

Gasket blank 100 comprises body 101, fingers 102, 103, 104 and 105, and slots 106, 107, 108 and 109. Gasket blank 100 is fabricated into a gasket by forming it about axis "A". This converts fingers 102 through 105 into corresponding curved tangs for connection to an electronic enclosure, with the tangs formed from fingers 102 and 103 being disposed opposite to the tangs formed from fingers 104 and 105, respectively.

Each of the fingers of gasket blank 100 extends the same distance from body 101. However, where required by the application, fingers 102 and 103 may extend a distance or distances from body 101 that is or are different from the distance or distances extended by fingers 104 and 105.

As illustrated in FIG. 1, fingers 102 and 104 are centered symmetrically about reference line "B". Similarly, Fingers 103 and 105 are centered symmetrically about reference line "C". Depending on the application, however, fingers 102 and 104 may be centered on different reference lines, as may fingers 103 and 105. For example, finger 104 may be centered symmetrically about a reference line passing through the center of slot 107 and finger 105 may be centered symmetrically about a reference line passing through the center of slot 109. As discussed below, the spacing of the fingers usually is a matter of design choice unless the spacing is predetermined or dictated by the spacing of receiving holes in the enclosure where a gasket will be placed.

As illustrated in FIG. 1, fingers 102 through 105 are rectilinear, although they may be other shapes depending on the application. Finger 102 is wider than finger 104, while finger 103 is wider than finger 105. This configuration is useful, as detailed below, for purposes of attaching a gasket to an enclosure. Depending on the application, however, it may be useful in gasket blank 100 to have fingers 102 through 105 be the same or approximately the same width.

Gasket blank 100 is provided with slots 106 through 109. These slots impart flexibility to a gasket made from gasket blank 100, and also permit the gasket to conform to the contours of irregular surfaces. Surface 114 of slot 106 is spaced from reference line "B" approximately the same distance as surface 110 of finger 102 is spaced from that axis, and surface 115 of slot 107 is spaced from reference line "B" approximately the same distance as surface 111 of finger 102 is spaced from that axis. Similarly, surface 116 of slot 108 is spaced from reference line "C" approximately the same distance as surface 112 of finger 103 is spaced from that axis, while surface 113 of slot 109 is spaced from reference line "C" approximately the same distance as surface 113 of finger 103 is spaced from that axis.

Depending upon the application, the slot configuration of gasket blank 100 may be varied. For example, slots 106 through 109 may be of different lengths and widths, be fewer or greater in number, be positioned farther from or closer to references lines "B" and "C" respectively, and be positioned on one side or the other of axis "A" of body 101.

Figure 2:
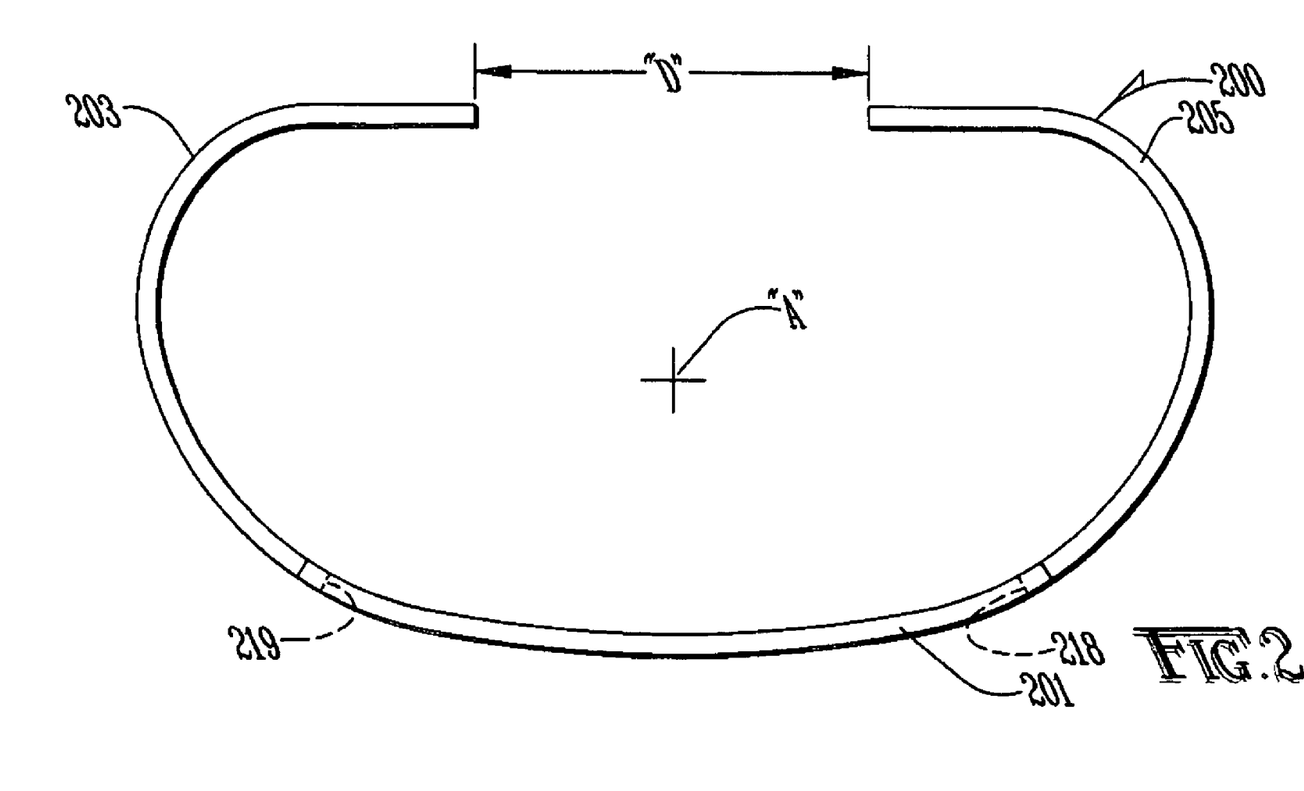
FIG. 2 depicts an end view of a gasket made from the gasket blank depicted in FIG. 1.

FIG. 2 is an end view of a gasket 200 fabricated from gasket blank 100 of FIG. 1. Gasket blank 100 has been fabricated into gasket 200 by forming it approximately around axis "A", which is seen end-on in FIG. 2. The cross-section of gasket 200 is roughly oval or ovaloid. One of ordinary skill in the art will recognize that other cross-sections may be employed, including round, square and irregular or asymmetric cross-sections.

Gasket 200 comprises body 201 and tangs 202 through 205, although only tangs 203 and 205 are visible in FIG. 2. Body 201 corresponds to body 101 of FIG. 1, while tangs 203 and 205 correspond to wide finger 103 and narrow finger 105 of gasket blank 100. Unseen tangs 202 and 204, which are behind tangs 203 and 204 respectively, correspond to wide finger 102 and narrow finger 104 of gasket blank 100. Gasket 200 also comprises slots 206 through 209, which correspond to slots 106 through 109 in gasket blank 100. None of slots 206 through 209 is visible in FIG. 2. The longitudinal ends of slot 209 are identified by dotted lines 218 and 219.

As shown in FIG. 2, the ends of tangs 202 and 203 do not meet, but rather are spaced apart a distance "D". In some circumstances, this spacing can facilitate installation of the gasket on an enclosure. Depending on the application, however, the spacing "D" illustrated in FIG. 2 may be enlarged, diminished or eliminated altogether, or the ends permitted to overlap.

Figure 3:
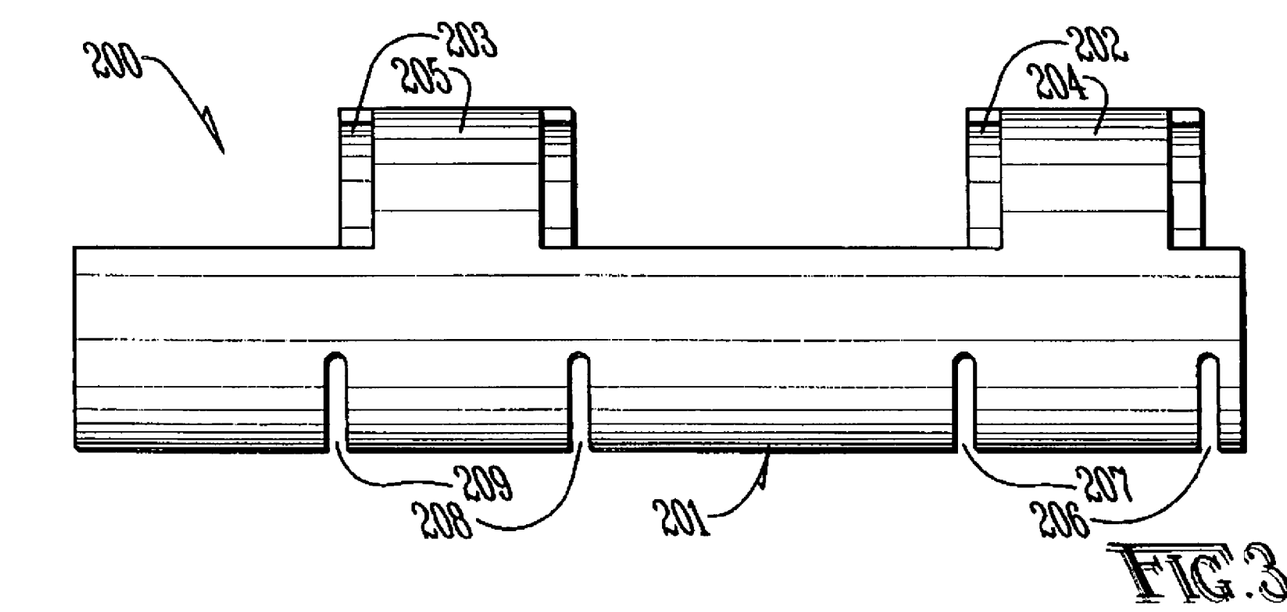
FIG. 3 depicts a side view of a gasket made from the gasket blank depicted in FIG. 1.

FIG. 3 is a side view of gasket 200 of FIG. 2. All tangs are visible in this depiction of gasket 200. Wide tangs 202 and 203 are visible behind narrow tangs 204 and 205. In addition, slots 206 through 209 are visible from the side at the bottom of body 201.

Figure 4:
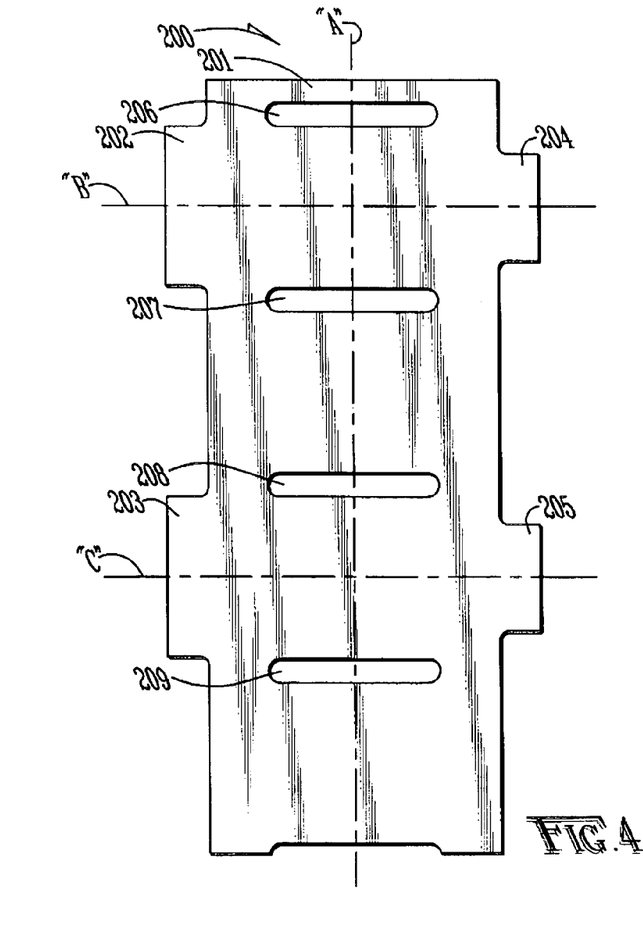
FIG. 4 depicts a top view of the gasket depicted in FIG. 3.

FIG. 4 is a top view of the gasket 200 of FIG. 2. As noted in discussing FIG. 1, the dimensions and configuration of gasket 200 may be varied widely, depending on the requirements of the particular application. Tangs 204 and 205 need not be narrower than tangs 202 and 203, and in fact may be wider than tangs 202 and 203. One or more of tangs 202 through 205 may extend further toward or further away from axis "A". The spacing between the set of tangs defined by tangs 202 and 204 on the one hand and tangs 204 and 205 on the other may vary as necessary. Other modifications will be apparent to one of ordinary skill in the art as the application at hand dictates.

Figure 5:
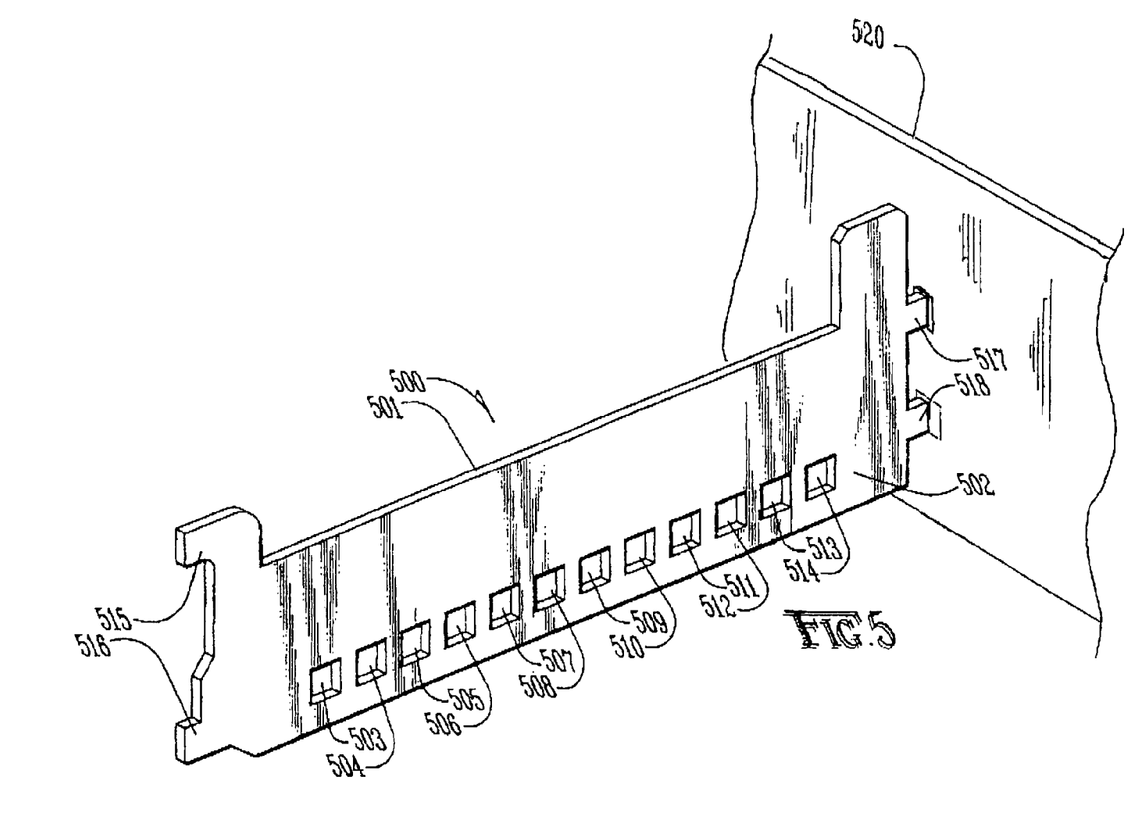
FIG. 5 depicts an enclosure insert of an exemplary embodiment of the present invention.

FIG. 5 depicts an enclosure insert 500 having a first edge 501 and a second edge 502. First edge 501 is a straight uninterrupted solid edge. Depending on the application, first edge 501 may be curved, interrupted by a series of raised steps or dimples for securing gasket tangs, defined by a series of holes of the type discussed below for second edge 502, or otherwise configured in a manner dictated by the application.

Second edge 502 is uniformly spaced from first edge 501. Second edge 502 is defined by a linear series of uniform square holes 503 through 514 that extend through enclosure insert 500. Depending on the application, square holes 503 through 514 need not be a linear series, but rather may be arrayed as a curve, step function or other non-linear configuration. Similarly, holes 503 through 514 need not be square. Depending on the application, the holes may be round, oval or some other shape known to those of skill in the art, or may be wholly or partly combined into a slot. In addition, second edge 502 may not involve holes at all, but rather may take on the form of upper edge 501 or its variants, as discussed above. Finally, first edge 501 and second edge 502 may be configured to be the same or substantially the same if so dictated by the application.

Enclosure insert 500 is provided with extensions 515 and 516 at a first end and extensions 516 and 517 at a second opposed end. These extensions facilitate mounting of enclosure insert 500 into an electronic enclosure 520.

Figure 6:
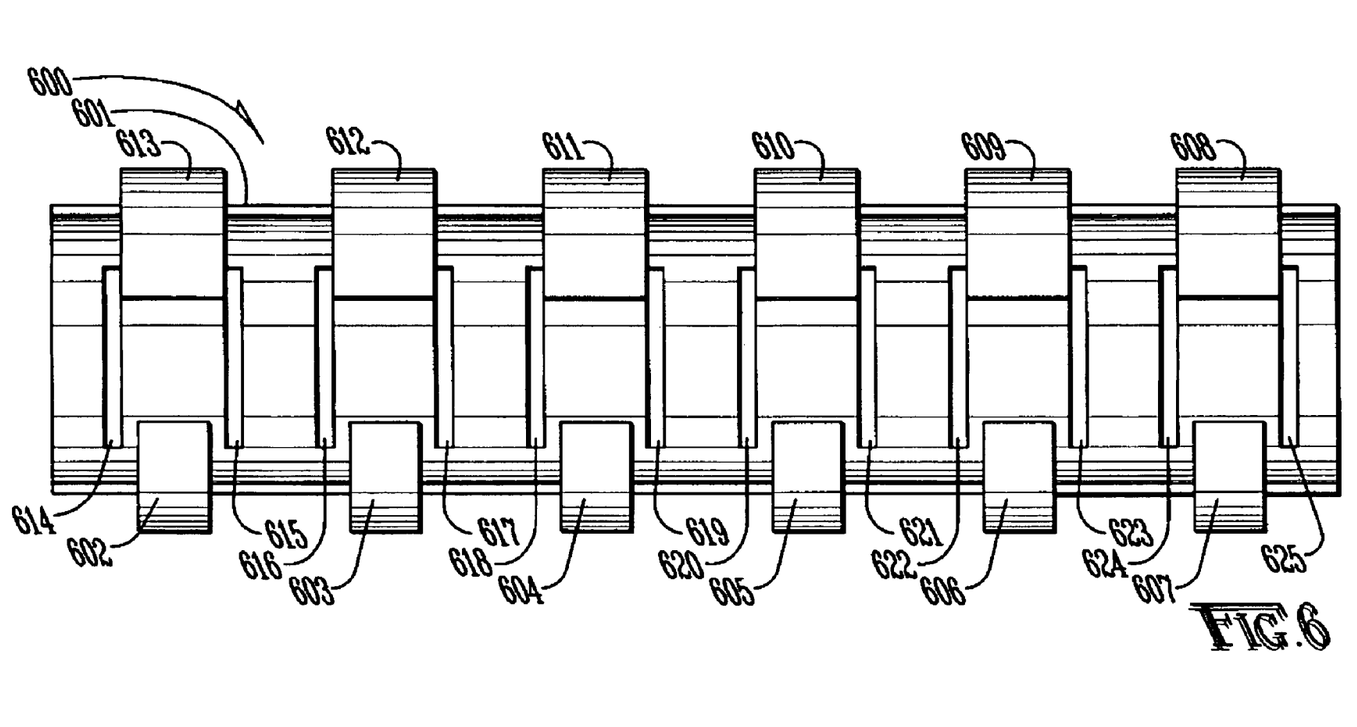
FIG. 6 depicts an extended gasket of the type depicted in FIG. 1

FIG. 6 depicts a top view of a gasket 600 having tangs 602 through 613 that are configured as six opposed sets, in contrast to the two opposed sets of tangs 202 through 205 of gasket 200 of FIG. 4. As in gasket 200, one tang in each opposed set is wider than the other tang. In FIG. 6, the wide tangs are tangs 608 though 613. The narrow tangs are tangs 602 through 607. As with body 201 of gasket 200 of FIG. 4, body 601 of gasket 600 is provided with a series of slots, in this case slots 614 through 625.

Figure 7:
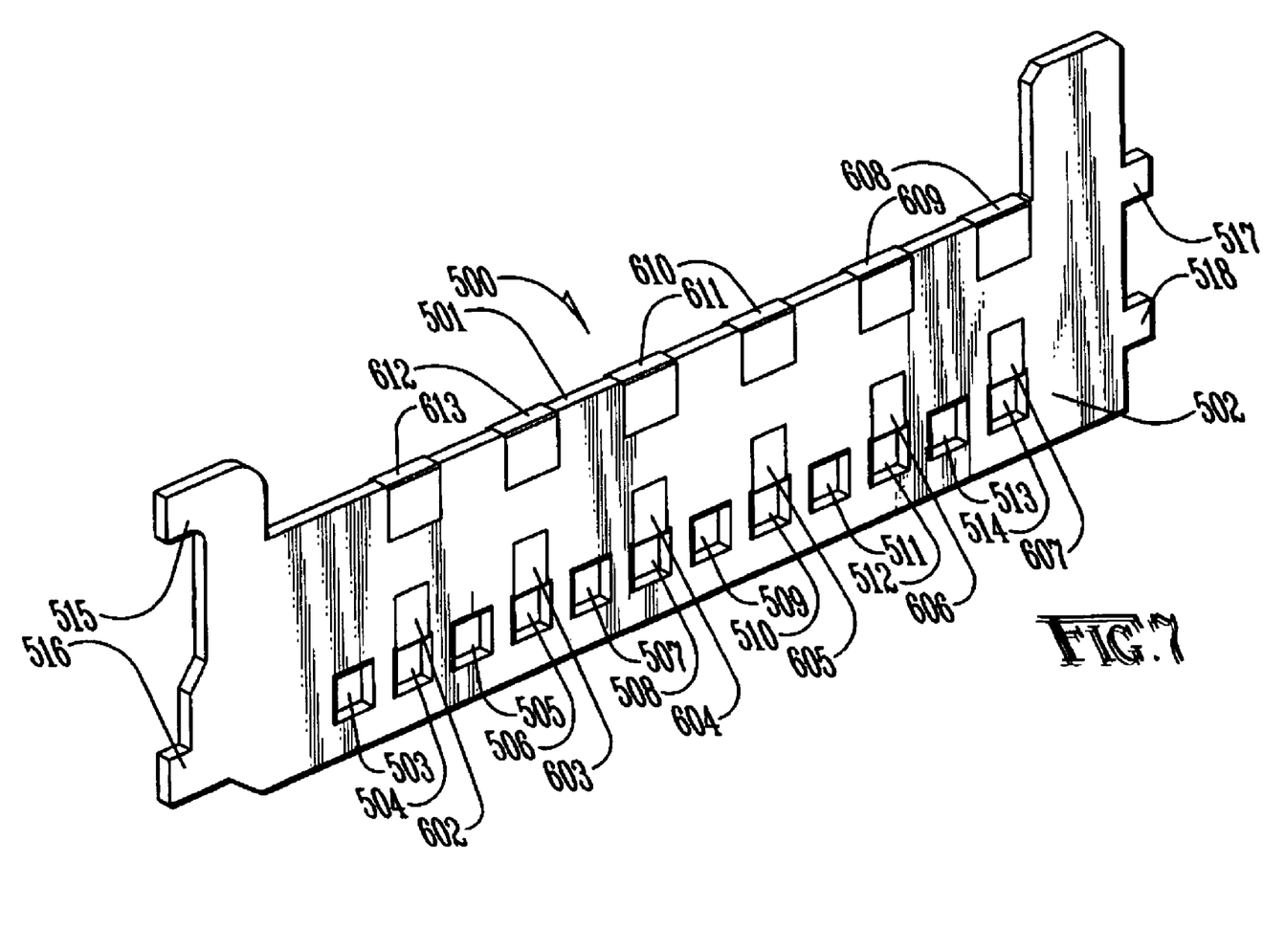
FIG. 7 depicts an assembly of the enclosure insert depicted in FIG. 5 with the gasket depicted in FIG. 6.

FIG. 7 depicts an assembly of the enclosure insert 500 of FIG. 5 with the gasket 600 of FIG. 6. Because the view of FIG. 7 does not reveal the side of enclosure insert 500 that is opposite to the side depicted, and because gasket 600 has been mounted on that opposite side, the body 601 of gasket 600 is not visible in FIG. 7. The tangs of gasket 600 are fully visible, however. Wide tangs 608 through 613 are hooked over first edge 501 of enclosure plate 500 and contact the visible face of enclosure plate 500. Narrow tangs 602 through 607 extend through alternate square holes 504, 506, 508, 510, 512 and 514 of second edge 502 of enclosure plate 500 and contact the visible face of enclosure plate 500.

Gasket 600 is assembled to enclosure insert 500 by first positioning gasket 600 on the opposite side of enclosure plate 500 so that tangs 602 through 613 face enclosure plate 500. Large tangs 608 through 613 are then hooked over first edge 501 of enclosure plate 500 and narrow tangs 602 through 607 are pushed through alternate square holes 504, 506, 508, 510, 512 and 514 of second edge 502 so that the narrow tangs hook on the upper edge of each of the specified square holes. Alternative methods of assembly include insertion of narrow tangs 602 through 607 into the specified square holes of second edge 502 as a first step, followed by hooking of large tangs 608 through 613 onto first edge 501. Another alternative method, among others, would involve simultaneous installation of narrow tangs 602 through 607 and wide tangs 608 though 613. Assembly may be accomplished by hand, robotically or by other known methods.

Figure 8:
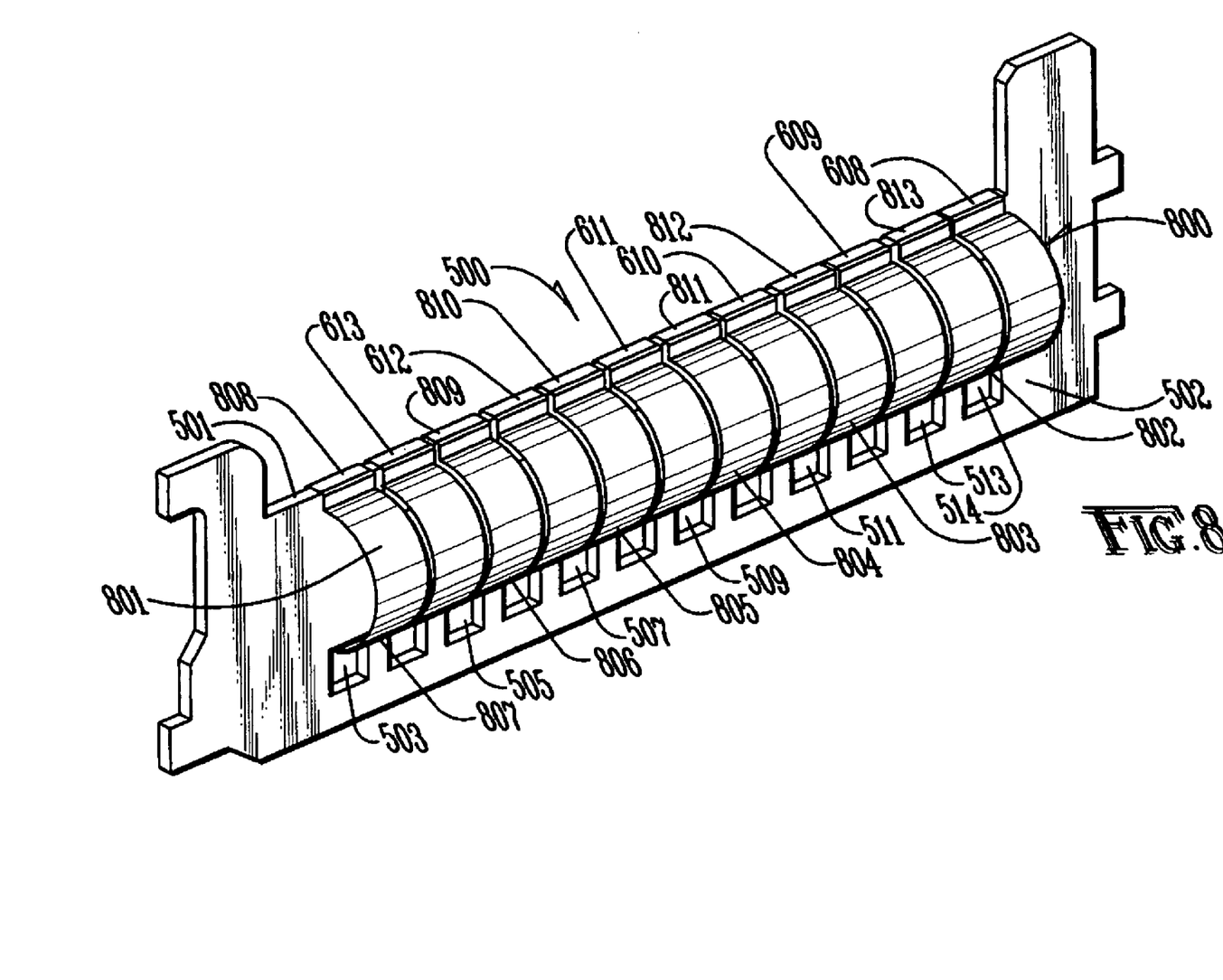
FIG. 8 depicts the assembly depicted in FIG. 7 with an additional gasket having the configuration of the gasket depicted in FIG. 6.

FIG. 8 depicts addition of a gasket 800 to the assembly of FIG. 7. Gasket 800 has the same configuration as gasket 600 and its numbering scheme corresponds to that of gasket 600. Gasket 800 is installed on the visible side of enclosure plate 500. Body 801 of gasket 800 is positioned between first edge 501 and second edge 502 of enclosure plate 500. Wide tangs 808 through 813 are hooked over first edge 501 of enclosure plate 500. Although not visible, the tangs contact the face of enclosure plate 500 on its opposite side. Narrow tangs 802 through 807 extend through alternate square holes 503, 505, 507, 509, 511 and 513 of second edge 502 of enclosure plate 500. Although not visible, the tangs contact the face of enclosure plate 500 on its opposite side. Gasket 800 is affixed to enclosure plate 500 by one or more of the methods discussed in connection with FIG. 7.

As shown in FIG. 8, the tangs of gasket 600 are interleaved with the tangs of gasket 800 on edge 501 of enclosure plate 500. Thus, moving right from the left end of edge 501, the first tang to appear is tang 808, the next to appear is tang 613, and the two tangs after that are tang 809 followed by tang 612. This interleaved pattern repeats itself for the full length of edge 501. This same interleaved pattern also is present in the narrow tangs that populate holes 503 through 514 of edge 502, although this is not visible in FIG. 8.

It can be advantageous that the wide tangs of both gasket 600 and gasket 800 grip edge 501. The wide tangs may provide more support for gaskets 600 and 800 in maintaining their grip on edge 501. This tends to keep gaskets 600 and 800 in proper orientation, that is, in the same planes defined by edge 501 and the faces of enclosure insert 500, and also may help gaskets 600 and 800 resist disturbances that could pull them from enclosure insert 500. As noted above, however, the width of the tangs of gasket 600 is a matter of design choice depending on the application.

From the foregoing information, it should now be obvious that the electromagnetic wave shielding apparatus described above may be used to provide a simple, efficient and easy-to-install solution for mitigating electromagnetic radiation emanating from an opening in a enclosure of an electronic device. The embodiments described and shown above have been presented as exemplary only. The following claims and their equivalents are not intended to be limited by the specific configuration, forms or arrangements of parts described and shown above.

What is claimed is:

1. A gasket for diminishing electromagnetic radiation from an enclosure having a first enclosure edge and a second enclosure edge remote from said first enclosure edge, said gasket comprising:
 a gasket body of substantially ovaloid cross-section comprising opposed first and second body edges;
 a plurality of first tangs extending from said first body edge for gripping said first enclosure edge; and
 a plurality of second tangs extending from said second body edge for gripping said second enclosure edge, wherein said second tangs are wider than said first tangs;
 wherein said gasket body is formed with one or more pairs of slots, each pair of slots being aligned with edges of one of the plurality of second tangs.

2. The gasket of claim 1 wherein one of said plurality of first tangs is rectilinear.

3. The gasket of claim 2 wherein one of said plurality of second tangs is rectilinear and deployed in opposition to said first tang.

4. A gasket system for diminishing the emission of electromagnetic radiation from an enclosure, said system comprising:
 an enclosure member comprising first and second enclosure edges remote from one another; and
 a gasket member of substantially ovaloid cross-section comprising first and second gasket edges, said first gasket edge comprising a plurality of first tangs extending from said first gasket edge and gripping said first enclosure edge and said second gasket edge comprising a plurality of second tangs extending from said second gasket edge and gripping said second enclosure edge, wherein said first tangs are wider than said second tangs;

wherein said gasket member is formed with one or more pairs of slots, each pair of slots being aligned with edges of one of the plurality of second tangs.

5. The system of claim 4 wherein said first enclosure edge is solid and said second enclosure edge comprises a plurality of holes.

6. The system of claim 5 wherein one of each of said first and second tangs is rectilinear and deployed in opposition to one another.

7. The system of claim 4 wherein said first and second enclosure edges comprise a plurality of holes.

8. A gasket system for diminishing the emission of electromagnetic radiation from an enclosure, said system comprising:
 an enclosure member comprising a first enclosure side, a second enclosure side opposite from said first enclosure side, and first and second enclosure edges that are remote from one another;
 a first gasket member disposed on said first enclosure side, said first gasket member comprising first and second gasket edges, the first gasket edge comprising a plurality of first tangs gripping said first enclosure edge and the second gasket edge comprising a plurality of second tangs gripping the second enclosure edge, wherein said gasket member is formed with one or more pairs of slots, each pair of slots being aligned with edges of one of the plurality of second tangs, wherein said first tangs are wider than said second tangs; and
 a second gasket member disposed on said second enclosure side, said second gasket member comprising third and fourth gasket edges, the third gasket edge comprising a plurality of third tangs gripping said first enclosure edge and the fourth gasket edge comprising a plurality of fourth tangs gripping said second enclosure edge.

9. The system of claim 8 wherein said first enclosure edge is solid and said second enclosure edge comprises a series of holes.

10. The system of claim 9 wherein one of each of said first and second tangs is rectilinear and deployed in opposition to one another and one of each of said third and fourth tangs is rectilinear and deployed in opposition to one another.

11. The system of claim 10 wherein said third tangs are wider than said fourth tangs.

12. The system of claim 8 wherein said tangs of said first gasket edge are interleaved with said tangs of said third gasket edge and said tangs of said second gasket edge are interleaved with said tangs of said fourth gasket edge.

13. The system of claim 8 wherein said first and second enclosure edges comprise a plurality of holes.

14. A gasket system for diminishing the emission of electromagnetic radiation from an enclosure, said system comprising:
 an enclosure member comprising first and second enclosure edges remote from one another;
 first means for gripping said first enclosure edge;
 second tang means for gripping said second enclosure edge, wherein said first means for gripping are wider than said second tang means for gripping; and
 body means for securing said first and second means to grip said first and second enclosure edges;
 wherein said gasket system is formed with one or more pairs of slots, each pair of slots being aligned with edges of one of the plurality of second tang means.

15. A method for diminishing the emission of electromagnetic radiation from an enclosure, said method comprising the following steps:
 forming a metal gasket blank comprising a body with opposed edges and fingers extending from each of said edges;
 forming from said metal gasket blank a gasket having an ovaloid cross-section and comprising a body with first and second opposed edges, first tangs extending from said first body edge and second tangs extending from said second body edge, wherein said gasket is formed with one or more pairs of slots, each pair of slots being aligned with edges of one of the plurality of second tangs, and wherein said first tangs are wider than said second tangs;
 positioning said metal gasket opposite from an enclosure having first and second enclosure edges remote from one another, said first tangs being positioned opposite said first enclosure edge and said second tangs being positioned opposite said second enclosure edge;
 advancing said gasket towards said enclosure so that a plurality of said first and second tangs contact said enclosure; and
 installing said gasket on said enclosure by pushing said gasket toward said enclosure so that a plurality of said first tangs are secured to said first enclosure edge and a plurality of said second tangs are secured to said second enclosure edge.

16. The method of claim 15 wherein said first enclosure edge is solid and said second enclosure edge comprises a series of holes.

* * * * *